United States Patent
Watson (10) Patent No.: US 7,228,622 B2
(45) Date of Patent: Jun. 12, 2007

(54) ELECTRONIC DEVICE CARRIER AND MANUFACTURE TAPE

(75) Inventor: Jeffrey Watson, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 245 days.

(21) Appl. No.: 10/916,746

(22) Filed: Aug. 11, 2004

(65) Prior Publication Data

US 2005/0016898 A1   Jan. 27, 2005

Related U.S. Application Data

(62) Division of application No. 10/301,217, filed on Nov. 20, 2002, now Pat. No. 7,127,805.

(51) Int. Cl.
 *H01R 11/00* (2006.01)
(52) U.S. Cl. .............. 29/827; 29/829; 29/830; 29/832; 29/835; 206/714; 206/716; 206/725
(58) Field of Classification Search .......... 29/827–834, 29/840–843, 846, 847; 74/52.4, 255; 206/713–717, 206/725, 820; 83/104, 149, 167; 324/754, 324/768
See application file for complete search history.

(56) References Cited

U.S. PATENT DOCUMENTS

| | | | |
|---|---|---|---|
| 4,657,137 A * | 4/1987 | Johnson ............... 206/714 |
| 4,966,281 A | 10/1990 | Kawanishi et al. |
| 5,119,934 A | 6/1992 | Karasawa et al. |
| 5,191,693 A * | 3/1993 | Umetsu ............... 29/429 |
| 5,234,104 A | 8/1993 | Schulte et al. |
| 5,472,085 A | 12/1995 | Gelzer |
| 5,690,233 A | 11/1997 | Kaneko |
| 5,706,952 A | 1/1998 | Bianca et al. |
| 5,732,465 A | 3/1998 | Tokita et al. |
| 5,857,572 A * | 1/1999 | Bird et al. ............ 206/713 |
| 5,878,890 A | 3/1999 | Kaneko |
| 5,960,961 A | 10/1999 | Gutentag |
| 5,966,903 A | 10/1999 | Dudderar et al. |
| 5,967,328 A | 10/1999 | Ziberna |
| 5,967,365 A | 10/1999 | Bogursky et al. |
| 6,016,918 A | 1/2000 | Ziberna |
| 6,017,623 A | 1/2000 | Nakanishi |
| 6,205,745 B1 | 3/2001 | Dudderar et al. |

(Continued)

FOREIGN PATENT DOCUMENTS

JP    7-165259    6/1995

*Primary Examiner*—Minh Trinh
(74) *Attorney, Agent, or Firm*—Blakely, Sokoloff, Taylor & Zafman LLP (57) ABSTRACT

A method and machine-readable medium are described for a flexible tape constructed of a material suitable to convey electronic devices through an entire manufacturing process without removing the electronic packages from the tape. According to one embodiment, part receiving areas are located within the tape. Each part receiving area is suitable to hold an electronic device. A retention channel encompasses each part receiving area. The retention channel extends substantially an entire length along each edge of each part receiving area. The retention channel comprises an upper tab and a lower tab wherein the upper tab is flush with an upper surface of the flexible tape and extends into the part receiving area and the lower tab extends below a lower surface of the flexible tape and into the part receiving area.

8 Claims, 9 Drawing Sheets

U.S. PATENT DOCUMENTS 6,332,536 B2 * 12/2001 Easton ........................ 206/714
6,357,594 B1 * 3/2002 Gutentag .................... 206/714
6,389,672 B1 * 5/2002 Ishii et al. ..................... 29/430
7,056,767 B2 * 6/2006 Liang et al. ................. 438/108

* cited by examiner

ELECTRONIC DEVICE CARRIER AND MANUFACTURE TAPE

RELATED APPLICATION

This application is a divisional of application Ser. No. 10/301,217, filed Nov. 20, 2002, now U.S. Pat. No. 7,127,805 and priority is claimed thereof.

FIELD

Various embodiments described below relate generally to the field of integrated circuit manufacturing. More particularly, the embodiments relate to an electronic package carrier tape suitable for transporting an integrated circuit package through a manufacturing process and testing.

BACKGROUND

In order to facilitate high quantity manufacturing of electronic parts, various means of handling the devices during manufacturing have been developed. Typically, a rigid, flat metal or plastic matrix tray is used to transport devices through or between various processes needed to assemble and test the electronic devices. In use, the tray containing electronic parts will be fed into a manufacturing process. However, the parts usually must be removed from the tray by handling equipment in order to be processed. Additionally, these trays are processed one at a time within the manufacturing process. Since the tray holds a relatively small number of parts, only small batches of parts may be processed from one tray. Therefore, while such trays are convenient for storing and shipping electronic parts, they are cumbersome and relatively inefficient.

An alternative medium for handling electronic parts in a manufacturing process is a continuous tape. Such a tape will contain a number of electronic parts retained within the tape by various means. The tape will be wound onto a reel from which it will be fed into the manufacturing or handling equipment. However, such tapes have several drawbacks. First, the materials typically used to make the tape are not able to withstand high temperatures. Therefore, the tape is not suitable for conveying parts through processes that require high heat such as an epoxy curing process. Second, the tapes must release the parts under a relatively light pressure to avoid damaging the parts. Therefore, flexing of the tape should be limited since excessive flexing of the tape containing rigid or semi-rigid parts may cause the tape to release the parts. Finally, while the tapes typically provide easy access to the top and bottom of mounted parts, they provide little protection to the edges of these parts, as they move through the manufacturing process. Specifically, parts such as integrated circuits having a number of pins extending from the bottom of the part may be damaged during handling.

BRIEF DESCRIPTION OF THE DRAWINGS

The appended claims set forth the features of various embodiments with particularity. These embodiments, together with their advantages, may be best understood from the following detailed description taken in conjunction with the accompanying drawings of which:

DETAILED DESCRIPTION

In the following description, for the purposes of explanation, numerous specific details are set forth in order to provide a thorough understanding. It will be apparent, however, to one skilled in the art that embodiments presented herein may be practiced without some of these specific details. In other instances, well-known structures and devices are shown in block diagram form.

Figure 1A:
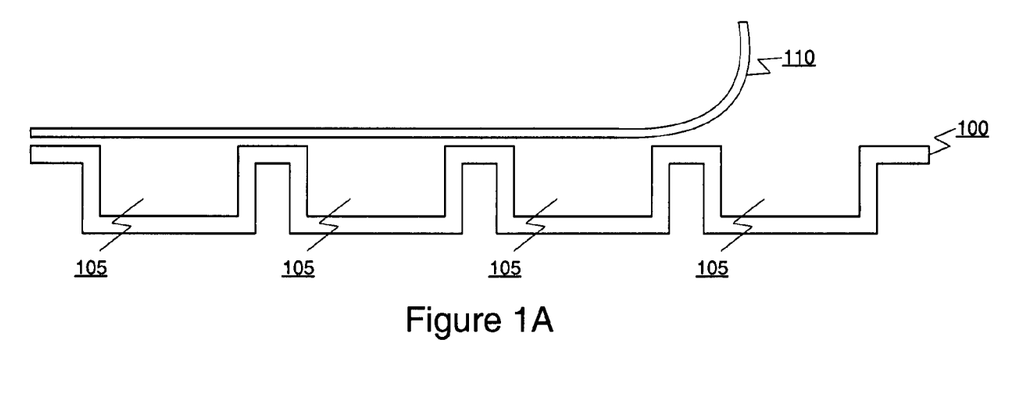
FIG. 1A is a side cross-sectional view of a tray type parts carrier.
Figure 1B:
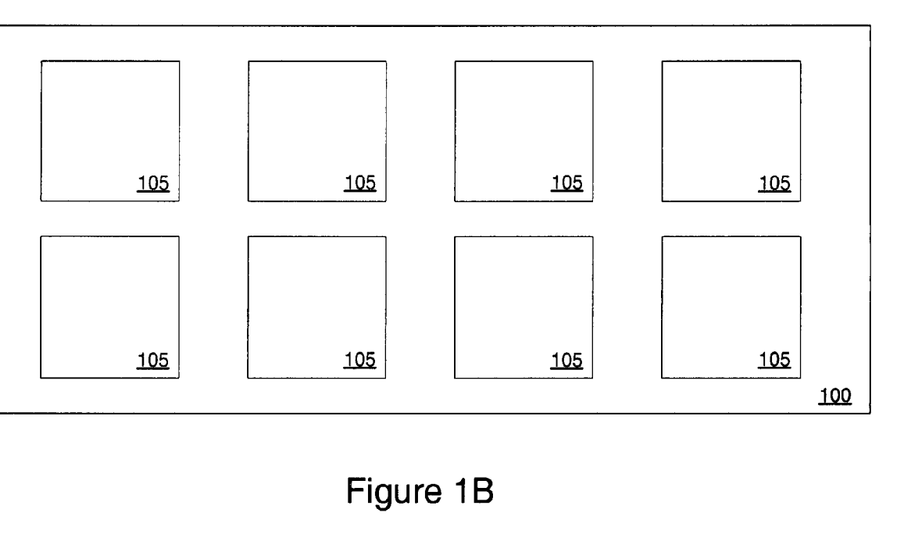
FIG. 1B is a top view of a tray type parts carrier.

FIG. 1A is a side cross-sectional view of a tray type parts carrier. FIG. 1B is a top view of the same tray type parts carrier. Such a tray type carrier is often referred to as a matrix tray. Typically, matrix tray 100 will have a number of part receptacles 105. Each receptacle is basically a pocket formed into tray 100 into which parts may be placed. A typical matrix tray 100 may have 8 to 12 part receptacles 105. Each part receptacle 105 will have placed into it an electronic device. Such a tray may be made of a variety of materials with metals such as stainless steel and various plastics being the most common.

Optionally, matrix tray 100 may have a thin cover 110 placed over top of the part receptacles 105 to protect and retain the parts within the tray 100. Cover 110 may be affixed to the tray with an adhesive or by other means such as fusing the cover to the tray with heat. Again, a variety of materials may be used for cover 110. A thin, transparent plastic is most common since it allows easy visual inspection of the parts contained in tray 100.

In use tray 100 containing electronic parts will be fed into a manufacturing process. However, since the parts are located in receptacles 105, they are largely inaccessible and must be removed from tray 100 by handling equipment in order to be processed. Additionally, these trays are processed one at a time within the manufacturing process. Since the tray holds a relatively small number of parts, only small batches of parts may be processed from one tray. Therefore, while such trays are convenient for storing and shipping electronic parts, they are cumbersome and relatively inefficient for use in various manufacturing processes.

An alternative medium for handling electronic parts in a manufacturing process is a continuous tape. Such a tape will contain a number of electronic parts retained within the tape by various means. The tape will be wound onto a reel from which if will be fed into the manufacturing or handling equipment.

Figure 2A:
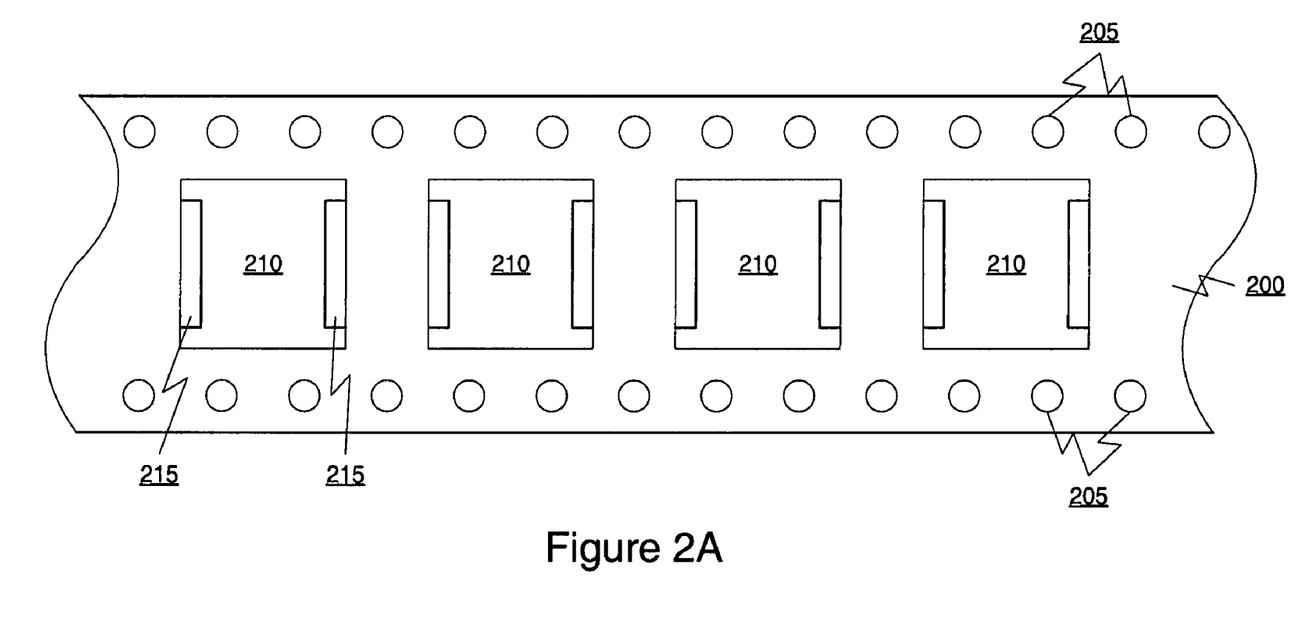
FIG. 2A is a top view of a carrier tape using an adhesive layer to secure mounted parts.

FIG. 2A is a top view of a carrier tape using an adhesive layer to secure mounted parts. In this example, thin flexible tape 200 is shown. Tape 200 contains a number of punches 205 along both long edges. Punches 205 enable manufacturing equipment to engage the tape and convey it through various processes. Tape 200 also contains a number of part receiving areas 210. Part receiving areas 210 are typically cutouts in the tape of whatever size and shape are appropriate to hold the parts to be processed. Since areas 210 are cutouts in the tape, both the top and bottom of the parts will be accessible when they are mounted on the tape. Each part receiving area 210 has a number of tabs 215 extending into part receiving area 210. Tabs 215 will have an adhesive surface onto which the part while be placed and thereby retained in part receiving area 210.

Figure 2B:
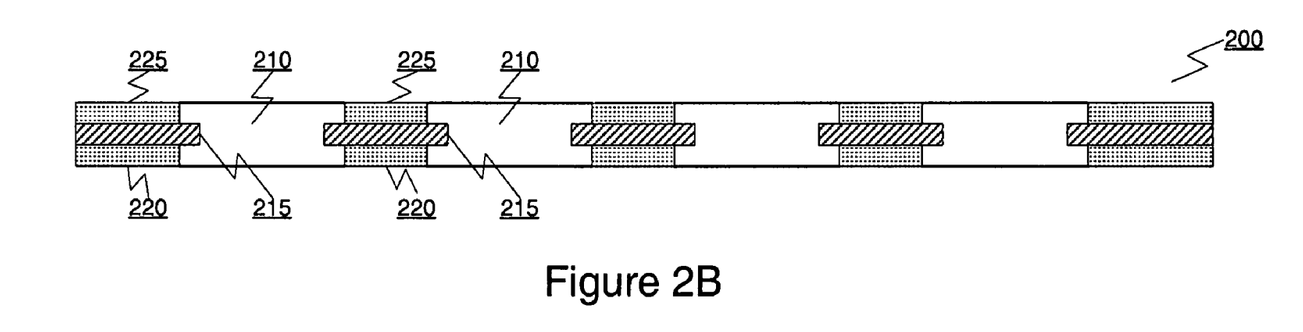
FIG. 2B is a side cross-sectional view of a carrier tape using an adhesive layer to secure mounted parts.

FIG. 2B is a side cross-sectional view of the carrier tape shown in FIG. 2A using an adhesive layer to secure mounted parts. Tape 200 containing a number of part receiving areas 210 is shown. From this perspective, the tape can be seen to contain an adhesive layer forming the adhesive tabs 215 that extend into part receiving areas 210. Adhesive layer 215 is sandwiched between two outside layers 220 and 225 that provide strength to the tape. The adhesive layer 215 is typically made of a very thin polymer with an adhesive surface that is strong enough to hold the part to the tape, but allow it to be released under pressure light enough to avoid damaging the part. Outside layers 220 and 225 are also made of a polymer but are slightly thicker and stronger than adhesive layer 215.

In use, tape 200, containing a large number of electronic parts, will be wound onto a reel from which it will be fed into the manufacturing or handling equipment. Therefore, such a tape can quickly and conveniently supply a large number of parts to the manufacturing equipment in a relatively continuous fashion. Additionally, since both the top and bottom of the part are accessible while it is mounted on the tape, some processes can be performed on the part while it is still mounted on the tape.

However, a tape such as tape 200 has several drawbacks. First, the materials making up the tape, particularly the adhesive layer, are generally not able to withstand high temperatures. Therefore, the tape is generally not suitable for conveying parts through processes that require high heat such as an epoxy curing process. Second, the adhesive on the adhesive tabs must release the parts under a relatively light pressure to avoid damaging the parts. Therefore, flexing of the tape should be limited since excessive flexing of the tape containing rigid or semi-rigid parts may cause the tape to release the parts. Finally, while the tape provides easy access to the top and bottom of mounted parts, nothing about the tape provides protection to the edges of these parts as they move through the manufacturing process. Specifically, parts such as integrated circuits having a number of pins extending from the bottom of the part may be damaged during handling.

Figure 3A:
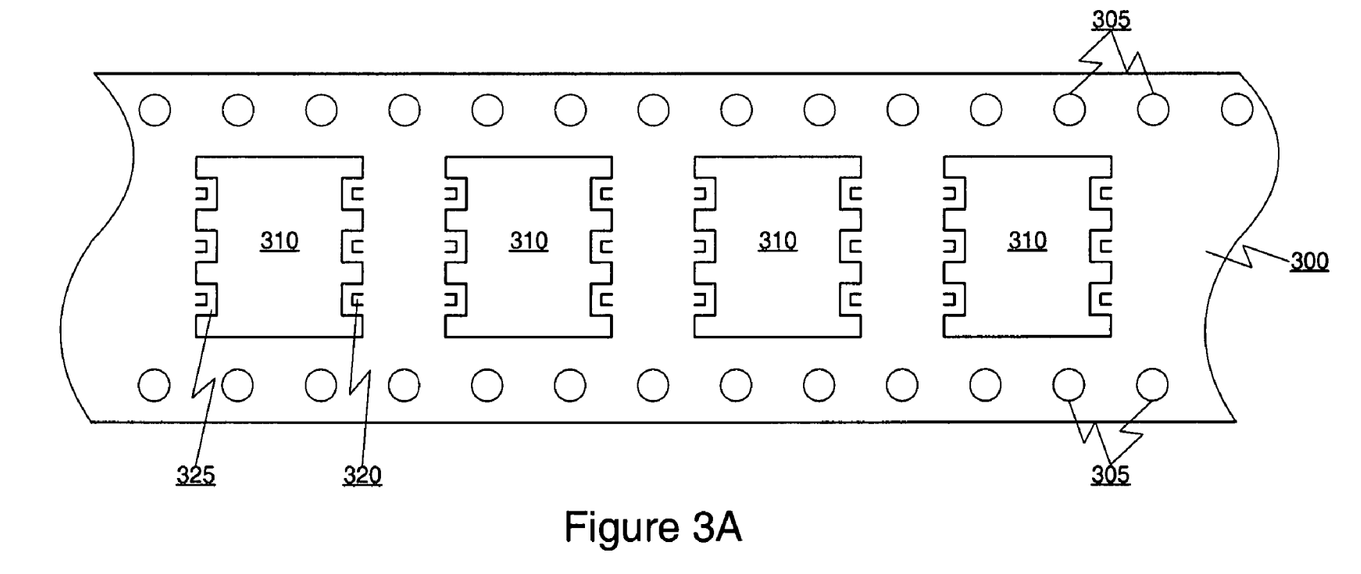
FIG. 3A is a top view of a carrier tape using part positioning tabs to secure mounted parts.

FIG. 3A is a top view of a carrier tape using part positioning tabs to secure mounted parts. This example illustrates a flat, flexible tape (tape 300). A relatively flexible material should be used to make tape 300. Typically, this material is a plastic. Tape 300 contains a number of punches 305 along both long edges. Punches 305 enable manufacturing equipment to engage the tape and convey it through various processes. Tape 300 also contains a number of part receiving areas 310. As with the previous example, part receiving areas 310 are cutouts in the tape of an appropriate size and shape to hold the parts to be processed. Each part receiving area 310 has a number of tabs 320 and 325 along the edges of the part receiving area 310 and extending into the part receiving area 310. Each tab consists of upper tab 320 and lower tab 325. Upper tab 320 and lower tab 325 may be punched or otherwise formed into two or more opposite edges of part receiving area 310.

Figure 3B:
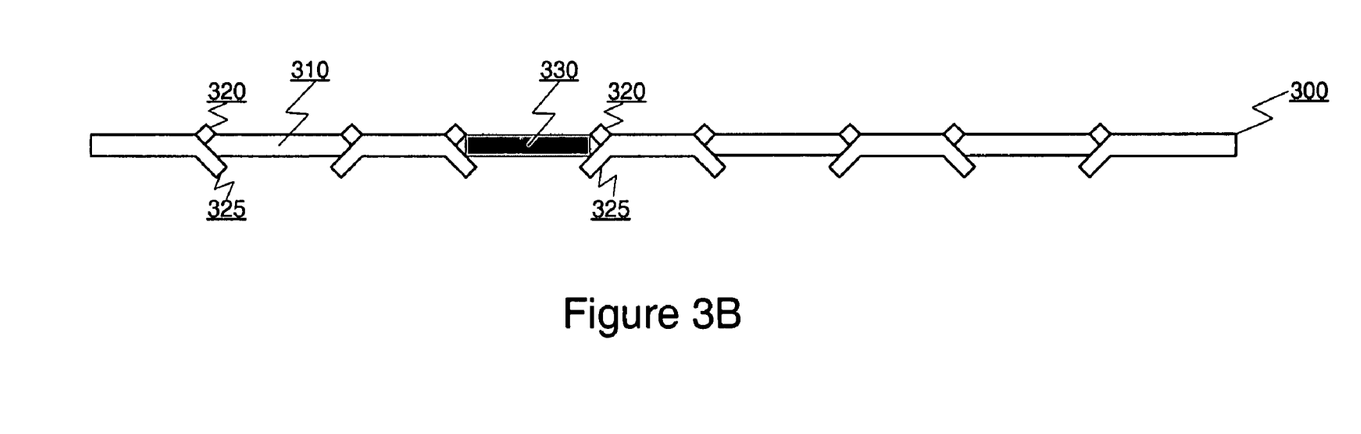
FIG. 3B is a side cross-sectional view of a carrier tape using part positioning tabs to secure mounted parts.

FIG. 3B is a side cross-sectional view of a carrier tape shown in FIG. 3A using part positioning tabs to secure mounted parts. Tape 300 containing a number of part receiving areas 310 is shown. From this perspective, electronic part 330 can be seen mounted in one of part receiving areas 310. Here, upper tab 320 and lower tab 325 are shown retaining electronic part 330 that has been mounted in part receiving area 310. Lower tab 325 extends below part 330 while upper tab 320 extends above part 330. Part 330 has been inserted into part receiving area 310 by pressing part 330 downward past shorter upper tab 320 and deflecting longer lower tab 325 downward until shorter upper tab 320 snaps over the top of part 330. Part 330 is now retained between the upper tab 320 and lower tab 325.

In use, tape 300, containing a large number of electronic parts, will be wound onto a reel from which if will be fed into the manufacturing or handling equipment. Therefore, such a tape can quickly and conveniently supply a large number of parts to the manufacturing equipment in a relatively continuous fashion. Additionally, since both the top and bottom of the part are accessible while it is mounted on the tape, some processes can be performed on the part while it is still mounted on the tape.

However, such a tape has several drawbacks. First, the materials used to make the tape are generally not able to withstand high temperatures. Therefore, the tape is generally not suitable for conveying parts through processes that require high heat such as an epoxy curing process. Second, the straight and relatively short tabs, especially upper tab 320, do not provide a completely secure hold on the parts. Therefore, flexing of the tape should be limited since excessive flexing of the tape containing rigid or semi-rigid parts may cause the tape to release the parts. Since the tabs extend above the top surface of the part, the tabs can interfere with processing requirements that require a flat top surface for manufacture, such as stencil printing. Finally, while the tape provides easy access to the top and bottom of mounted parts, no protection is provided to parts such as integrated circuits having a number of pins or connections extending from the bottom of the part. Therefore, such pins or connections may be damaged during handling.

Figure 4A:
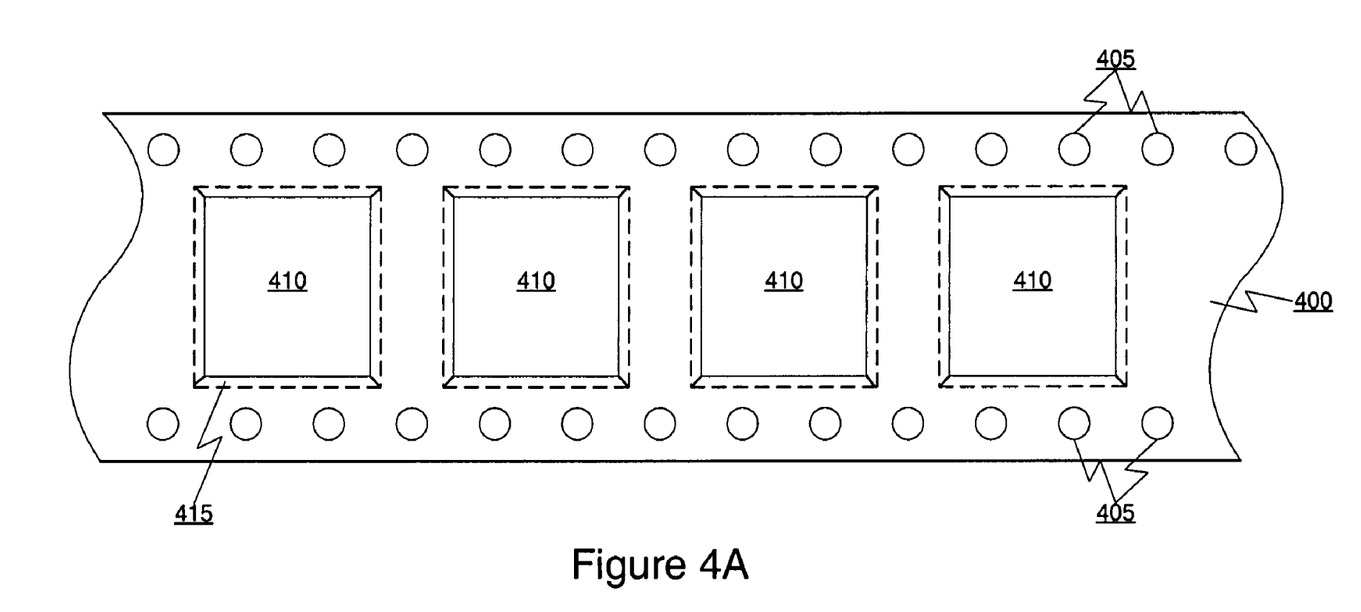
FIG. 4A is a top view of a carrier tape using preformed part retention pockets according to one embodiment.

FIG. 4A is a top view of a carrier tape using preformed part retention pockets according to one embodiment. Here, a tape 400 is shown containing a number of part receiving areas 410 and a number of punches 405 along both long edges. Punches 405 enable manufacturing equipment to engage the tape and convey it through various processes. Tape 400 is constructed of a material suitable to convey electronic devices through a manufacturing process without removing the electronic packages from the tape. A material suitable for making tape 400 should be able to handle high temperatures encountered in some processes such as curing of epoxy. Some of these processes reach temperatures of approximately 260 degrees centigrade. Materials used to make the tape should be able to withstand such temperatures. Examples of such materials may include metals such as thinly rolled stainless steel or a high melting point temperature polymer.

A number of part receiving areas 410 are located within tape 400. Each part receiving area 410 is of a size and shape suitable to hold an electronic device to be processed. A typical electronic package has an average height of 42 mm and an average thickness of 1 mm. In one embodiment, each part receiving area is 2 mm greater than the overall dimensions of the typical electronic package. Retention channel 415 encompasses each part receiving area 410. The retention channel extends substantially the entire length along each edge of each part receiving area 410. However, as will be discussed below, retention channel 415 need not extend the entire length of the part receiving area 410.

Figure 4B:
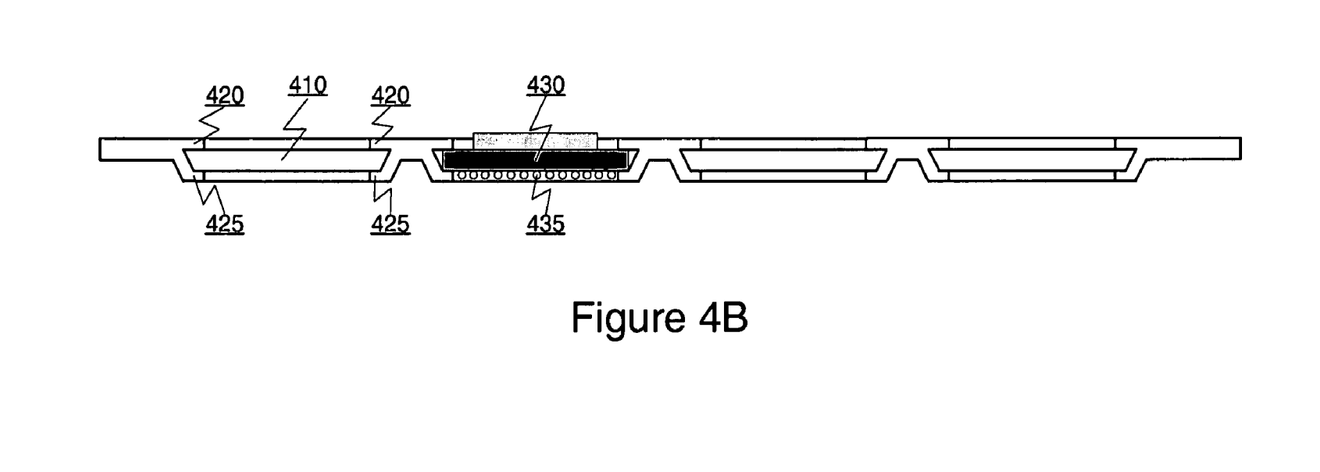
FIG. 4B is a side cross-sectional view of a carrier tape using preformed part retention pockets according to one embodiment.

FIG. 4B is a side cross-sectional view of a carrier tape using preformed part retention pockets according to one embodiment. From this perspective, the part retention channel 415 can be seen to comprise upper tab 420 and lower tab 425. Upper tab 420 is flush with the upper surface of tape 400 and extends into part receiving area 410. Lower tab 425 extends below the lower surface of tape 400 and into part receiving area 410. Industry standard plastic tape cutting, stamping or thermo-forming processes may be used to form these channels.

Upper tab 420 and lower tab 425 are shown retaining electronic part 430 that has been mounted in part receiving area 410. In this example, the part illustrated represents an integrated circuit package containing solder ball type connectors 435 on a bottom side (as viewed). Part 430 has been inserted into part receiving area 410 by pressing part 430 downward deflecting upper tab 420 downward until upper tab 420 snaps over the top of part 430. Part 430 is now retained between upper tab 420 and lower tab 425. The shape of lower tab 425 allows upper tab 420 to be longer and deflect downward much further than in the previous example. In one embodiment, upper tab 420 is approximately 2 mm in length and lower tab 425 is approximately 3 mm in length. Therefore, the upper tab 420 and lower tab 425 may extend further into part receiving area 410 and over and under mounted part 430 providing a secure hold on part 430. Tape 400 may then be flexed to a great degree during processing without releasing part 430.

Figure 5A:
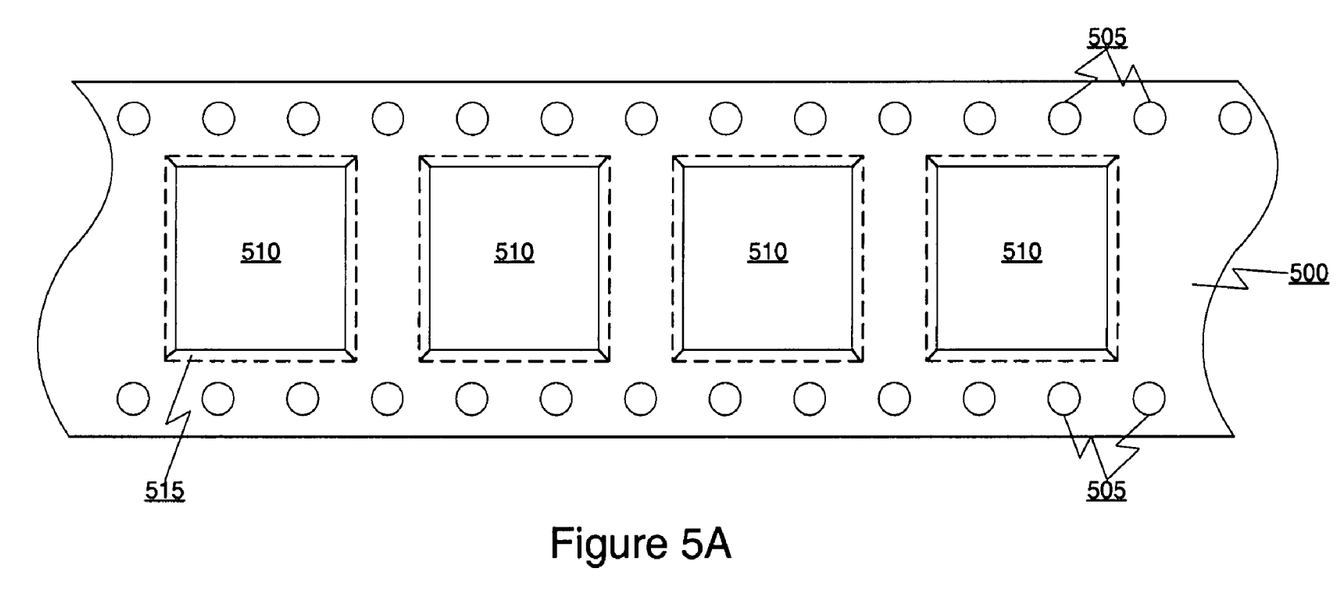
FIG. 5A is a top view of a carrier tape using preformed part retention pockets and protective fences according to one embodiment.

FIG. 5A is a top view of a carrier tape using preformed part retention pockets and protective fences according to one embodiment. Tape 500 is shown containing a number of part receiving areas 510 and a number of punches 505 along both long edges. Part receiving areas 510 are located within tape 500. Retention channel 515 encompasses each part receiving area 510. Retention channel 515 extends substantially the entire length along each edge of each part receiving area 510. However, as will be discussed below, retention channel 515 need not extend the entire length of part receiving area 510.

Figure 5B:
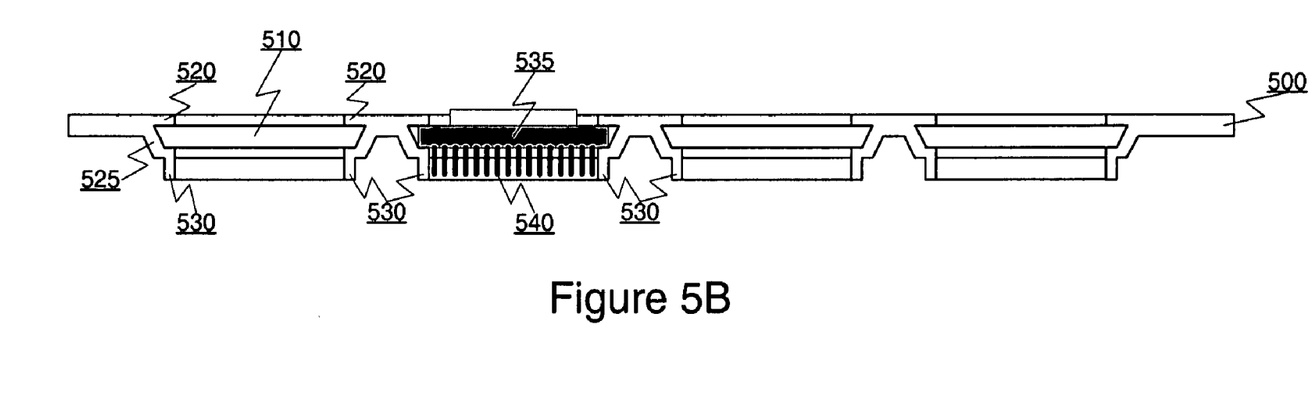
FIG. 5B is a side cross-sectional view of a carrier tape using preformed part retention pockets and protective fences according to one embodiment.

FIG. 5B is a side cross-sectional view of the carrier tape shown in FIG. 5A using preformed part retention pockets and protective fences according to one embodiment. From this perspective, the part retention channel 515 can be seen to comprise upper tab 520 and lower tab 525. Upper tab 520 is flush with the upper surface of tape 500 and extends into part receiving area 510. Lower tab 525 extends below the lower surface of tape 500 and into part receiving area 510.

Also, in this perspective, protective fences 530 are visible. Protective fences 530 extend downward from lower tabs 525. Protective fences 530 extend far enough downward to provide protection to the electronic parts mounted in part receiving areas 510. In this example, integrated circuit package 535 is shown mounted in one of the part receiving areas 510. The integrated circuit package 535 shown has a number of pins 540 extending downward from the bottom of integrated circuit package 535. Protective fences 530 extend as far down as pins 540 to provide protection to pins 540. Alternatively, protective fences 530 may extend further than pins 540 to provide additional protection. In the example of the integrated circuit package 535, the depth of tape 500 is approximately 5 mm. Industry standard plastic tape cutting, stamping or thermo-forming processes may be used to form the fences.

In the example illustrated, retention channel 515 runs completely around part receiving area 510. Protective fences 530 extend from lower tab 525 along the entire length of lower tab 525 the entire way around part receiving area 510. However, as mentioned above and as will be described below, retention channel 515 need not extend along the entire length of all sides of part receiving area 510. Additionally, protective fence 530 need not extend along the entire length of lower tab 525 on all sides of part receiving area 510. For example, fences 530 along each side of part receiving areas 510 may not extend all the way to each corner thereby allowing tape 500 to be slightly more flexible. Alternatively, fence 530 may cover less than all of the sides of part receiving areas 510. For example, a fence 530 may extend from the lower tab 525 of only one edge of part receiving area 510. The edge to be covered may be the leading edge of the part receiving area as the tape is conveyed through a manufacturing process.

Figure 6A:
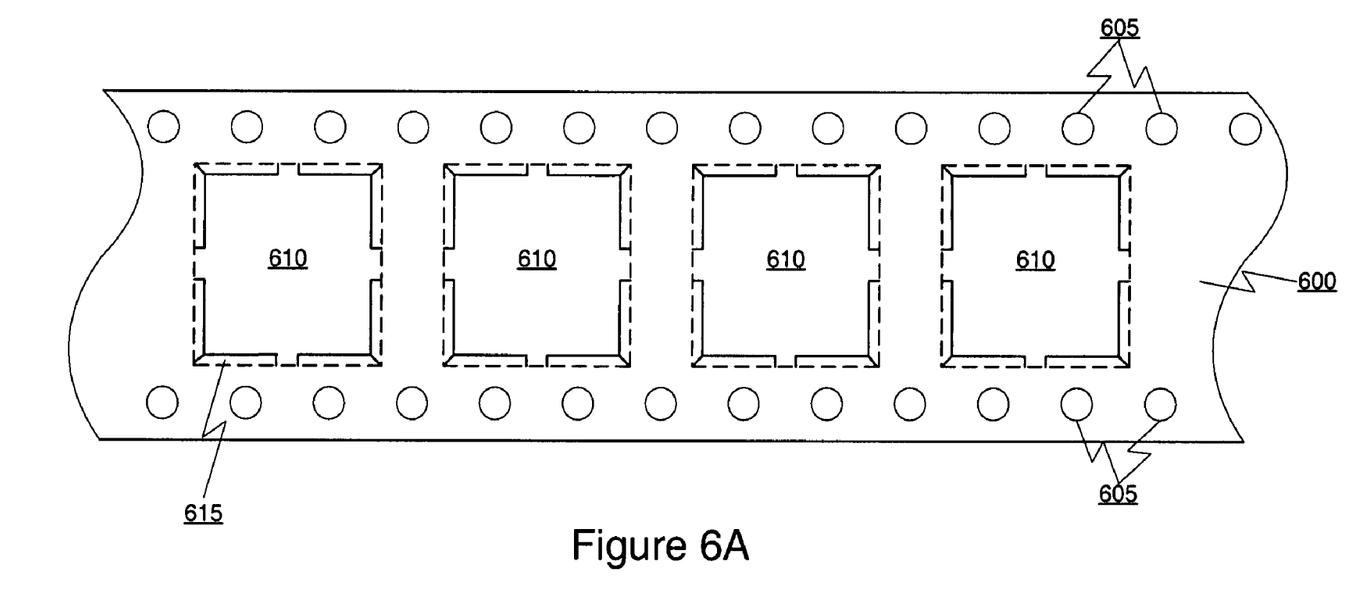
FIG. 6A is a top view of a carrier tape using preformed part retention pockets according to another embodiment.
Figure 6B:
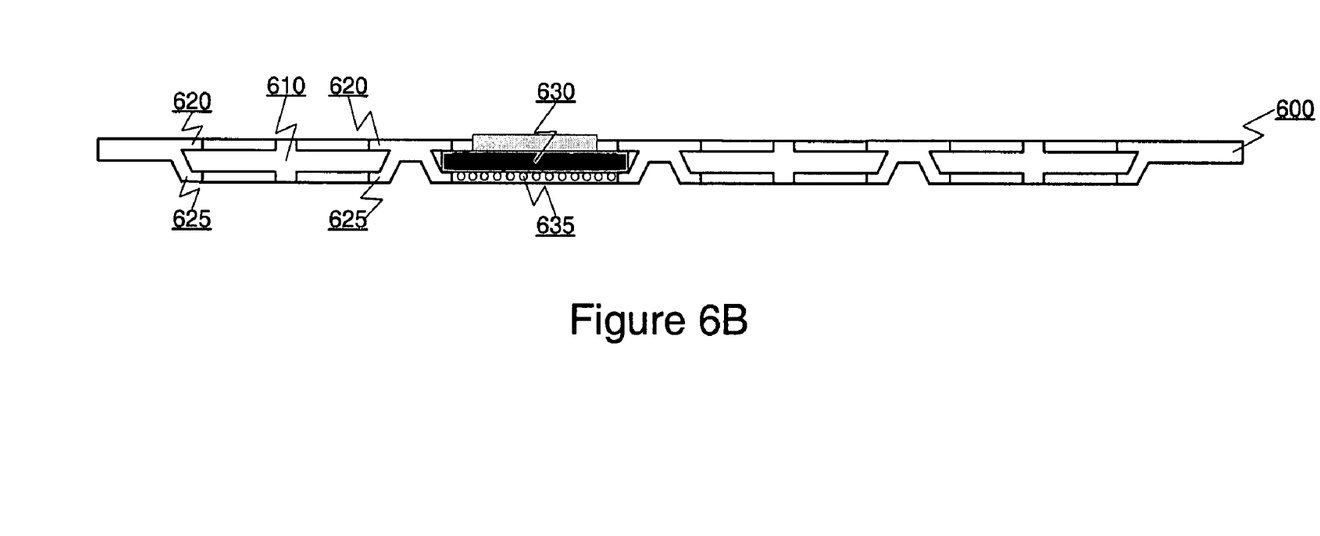
FIG. 6B is a side cross-sectional view of a carrier tape using preformed part retention pockets according to another embodiment.

FIG. 6A is a top view of a carrier tape using preformed part retention pockets according to another embodiment. FIG. 6B is a side cross-sectional view of the same carrier tape using preformed part retention pockets according to another embodiment. Tape 600 is shown containing a number of part receiving areas 610 and a number of punches 605 along both long edges. A number of part receiving areas 610 are located within the tape 600. Retention channel 615 encompasses each part receiving area 610. From this perspective, retention channel 615 can be seen to comprise upper tab 620 and lower tab 625. Upper tab 620 is flush with the upper surface of tape 600 and extends into part receiving area 610. Lower tab 625 extends below the lower surface of tape 600 and into part receiving area 610.

Upper tab 620 and lower tab 625 are shown retaining electronic part 630 that has been mounted in part receiving area 610. In this example, the part illustrated represents an integrated circuit package containing solder ball type connectors 635 on a bottom side (as viewed). Part 630 has been inserted into part receiving area 610 by pressing part 630 downward deflecting upper tab 620 downward until upper tab 620 snaps over the top of part 630. Part 630 is now retained between upper tab 620 and lower tab 625.

Retention channel 615 extends substantially the entire length along each edge of each part receiving area 610. However, as mentioned above, retention channel 615 need not extend the entire length of part receiving area 610. In this example, a gap exists in the middle of each retention channel 615. One purpose of including such gaps in the retention channel would be to allow the electronic parts to be inserted or removed more easily and allow the tape to be more flexible.

Figure 7A:
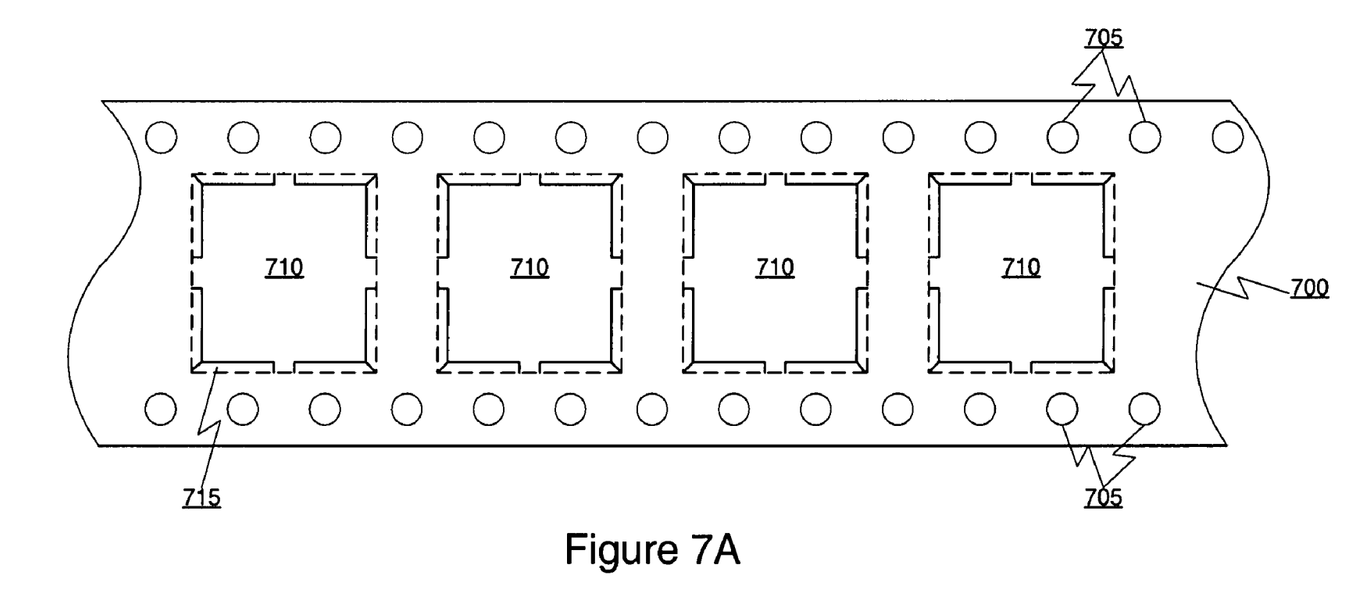
FIG. 7A is a top view of a carrier tape using preformed part retention pockets and protective fences according to another embodiment.

FIG. 7A is a top view of a carrier tape using preformed part retention pockets and protective fences according to another embodiment. Tape 700 is shown containing a number of part receiving areas 710 and a number of punches 705 along both long edges. A number of part receiving areas 710 are located within tape 700. Retention channel 715 encompasses each part receiving area 710. Retention channel 715 extends substantially the entire length along each edge of each part receiving area 710. In this example, a gap exists in the middle of each retention channel.

Figure 7B:
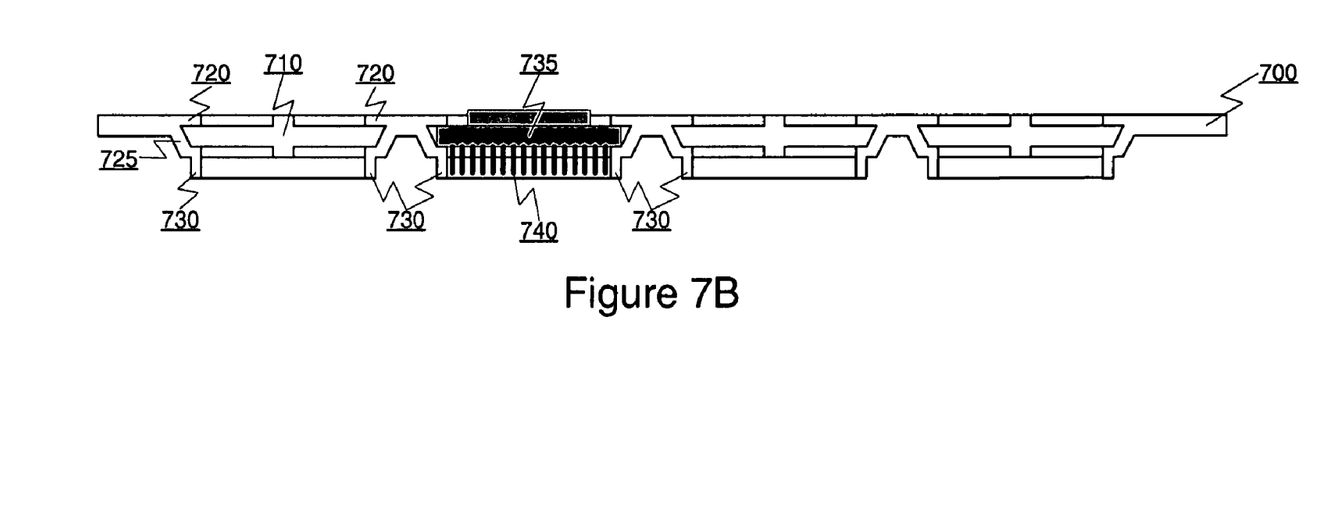
FIG. 7B is a side cross-sectional view of a carrier tape using preformed part retention pockets and protective fences according to another embodiment.

FIG. 7B is a side cross-sectional view of the same carrier tape using preformed part retention pockets and protective fences according to another embodiment. From this perspective, the part retention channel 715 can be seen to comprise upper tab 720 and lower tab 725. Upper tab 720 is flush with the upper surface of tape 700 and extends into part receiving area 410. Lower tab 725 extends below the lower surface of tape 700 and into part receiving area 710.

In this view, protective fences 730 are visible. In this example, integrated circuit package 735 is shown mounted in one of the part receiving areas 710. Package 735 has a number of pins 740 extending downward from the bottom of package 735. Of course a part such as an integrated circuit package using solder ball type connections may also be mounted on the tape.

In the example illustrated, retention channel 715 does not extend completely around the part receiving area 710. Fences 730 can extend from lower tab 725 along the entire length of lower tab 725 or the entire way around part receiving area 710. As mentioned above, protective fence 730 need not extend along the entire length of lower tab 725 on all sides of part receiving area 710. For example, fences 730 along each side of part receiving areas 710 may not extend all the way to each corner. Alternatively, fence 730 may cover less than all of the sides of part receiving areas 710.

Figure 8A:
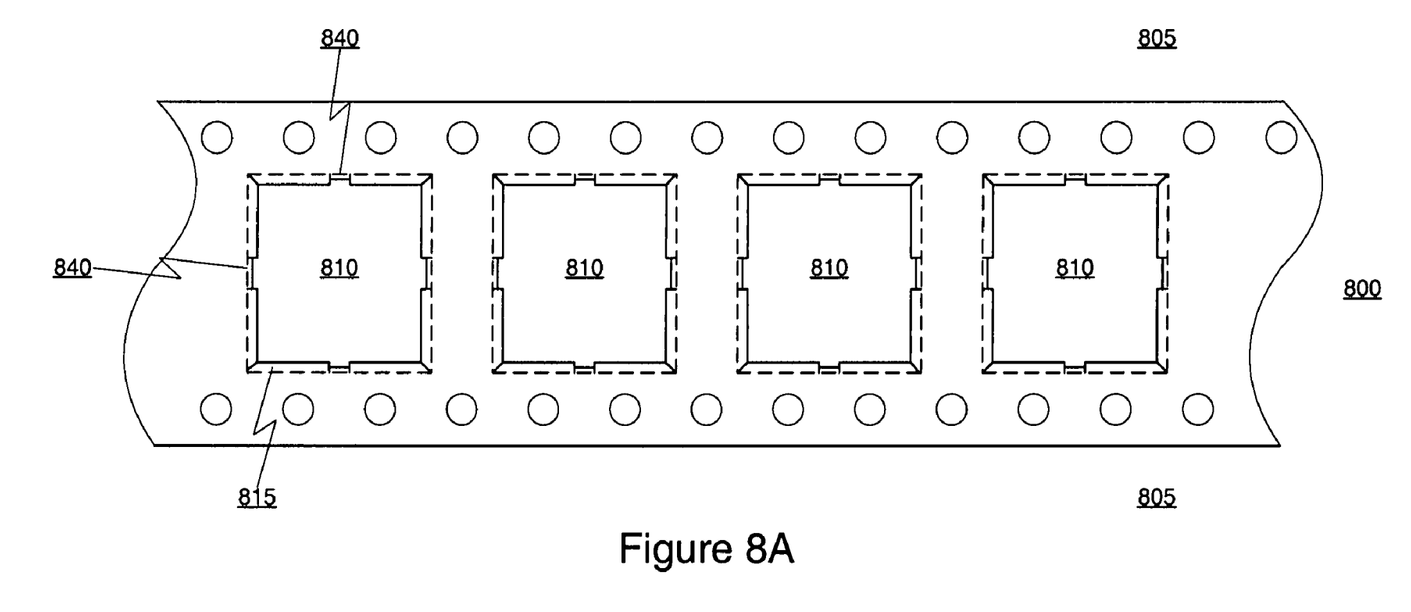
FIG. 8A is a top view of a carrier tape using preformed part retention pockets and positioning brackets according to one embodiment.

FIG. 8A is a top view of a carrier tape using preformed part retention pockets and positioning brackets according to one embodiment. Tape 800 is shown containing a number of part receiving areas 810 and a number of punches 805 along both long edges. Part receiving areas 810 are located within tape 800. Retention channel 815 encompasses each part receiving area 810. Retention channel 815 extends substantially the entire length along each edge of each part receiving area 810. However, part positioning brackets 840 have been placed in approximately the middle of each retention channel 815. Brackets 840 can be formed from a punched out and bent down portion of the upper tab of the retention channel 815.

In alternative embodiments, the position of brackets 840 may vary. For example, brackets 840 may be located in a position other than the middle of retention channel 815. Additionally, the number of brackets 840 may vary. For example, there may be more than one bracket per side or less than one bracket per side. That is, a particular application may use only one, two or three brackets per part receiving area or more than the four brackets shown in FIG. 8A.

Figure 8B:
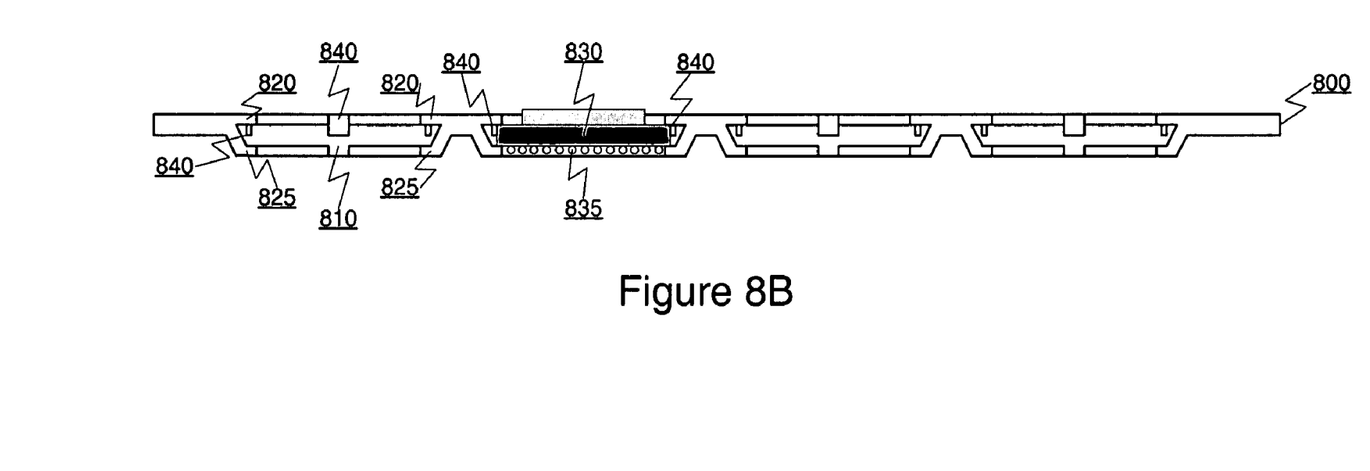
FIG. 8B is a side cross-sectional view of a carrier tape using preformed part retention pockets and positioning brackets according to one embodiment.

FIG. 8B is a side cross-sectional view of the same carrier tape using preformed part retention pockets and positioning brackets according to one embodiment. From this perspective, part retention channel 815 can be seen to comprise upper tab 820 and lower tab 825. Upper tab 820 is flush with the upper surface of tape 800 and extends into part receiving area 810. Lower tab 825 extends below the lower surface of tape 800 and into part receiving area 810.

From this view, brackets 840 can be seen to extend downward into part receiving area 810. Electronic part 830, is shown mounted in part receiving area 810. Brackets 840 can be seen to abut the edges of mounted part 830 thereby reducing the ability of part 830 to shift within retention channel 815 thereby maintaining the position of part 830 approximately in the center of part receiving area 810.

Figure 9A:
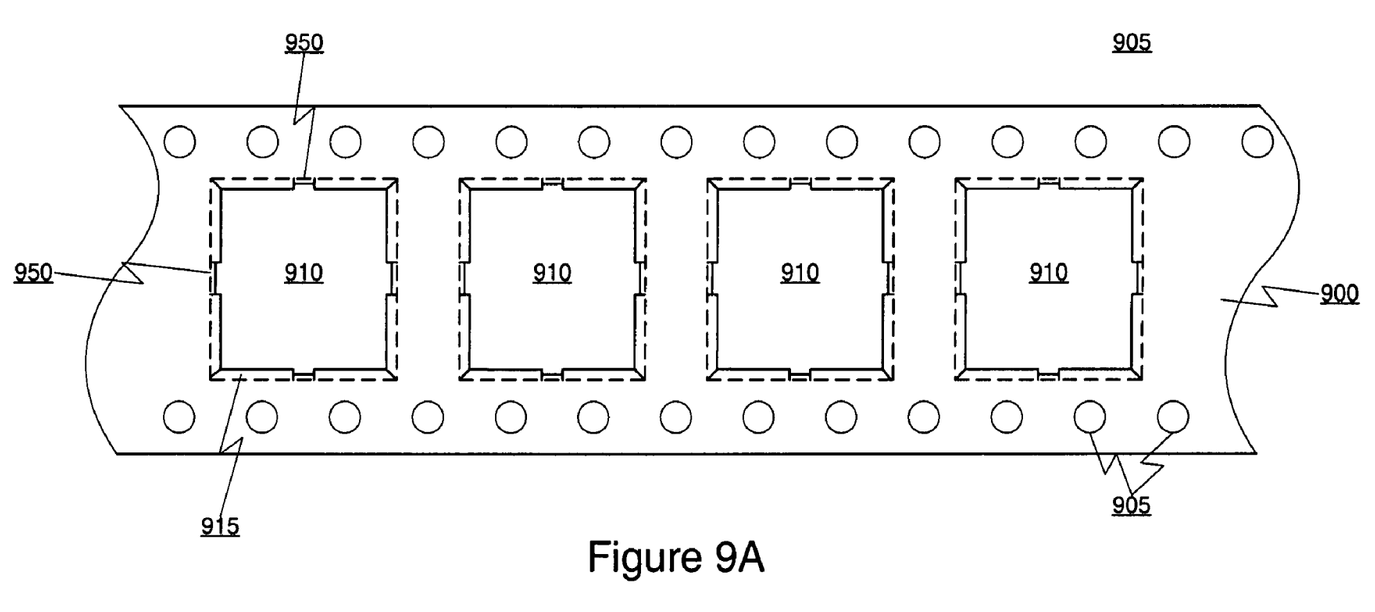
FIG. 9A is a top view of a carrier tape using preformed part retention pockets, positioning brackets, and protective fences according to one embodiment.

FIG. 9A is a top view of a carrier tape using preformed part retention pockets, positioning brackets, and protective fences according to one embodiment.

Figure 9B:
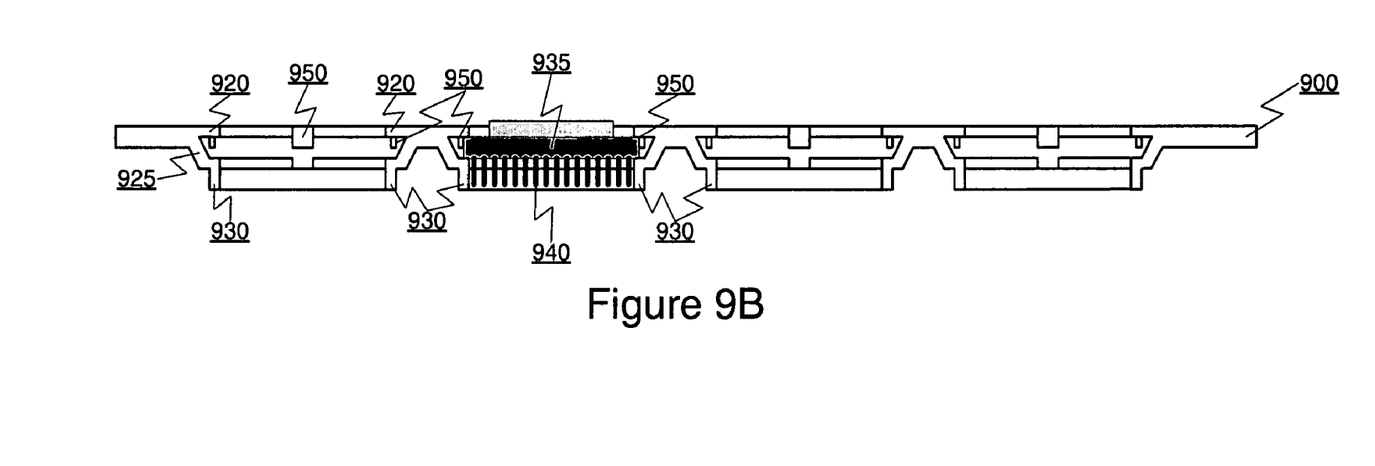
FIG. 9B is a side cross-sectional view of a carrier tape using preformed part retention pockets, positioning brackets, and protective fences according to one embodiment.

FIG. 9B is a side cross-sectional view of the same carrier tape using preformed part retention pockets, positioning brackets, and protective fences according to one embodiment. Tape 900 is shown containing a number of part receiving areas 910 and a number of punches 905 along both long edges. Part receiving areas 910 are located within tape 900. Retention channel 915 encompasses each part receiving area 910. Retention channel 915 extends substantially the entire length along each edge of each part receiving area 910. Part positioning brackets 940 have been placed in approximately the middle of each retention channel 915. Additionally, protective fences 930 extend downward from the bottom of lower tabs 925 of retention channels 915. In this example, integrated circuit package 935 is shown mounted in one of the part receiving areas 910. Package 935 has a number of pins 940 extending downward from the bottom of package 935. Of course, a part such as an integrated circuit using solder ball type connections may alternatively be mounted on the tape.

From this perspective, part retention channel 915 can be seen to comprise upper tab 920 and lower tab 925. Upper tab 920 is flush with the upper surface of tape 900 and extends into part receiving area 910. Lower tab 925 extends below the lower surface of tape 900 and into part receiving area 910.

In the example illustrated, fences 930 extend from lower tab 925 along the entire length of lower tab 925 or the entire way around part receiving area 910. As mentioned above, protective fence 930 need not extend along the entire length of lower tab 925 on all sides of part receiving area 910. For example, fences 930 along each side or part receiving areas 910 may not extend all the way to each corner. Alternatively, fence 930 may cover less than all of the sides of part receiving areas 910. Also, as explained above, the position of brackets 940 may vary. For example, brackets 940 may be located in a position other than the middle of retention channel 915. Additionally, the number of brackets 940 may vary.

Regardless of which of the various embodiments described above or combinations thereof, use of the tape will be the same. The tape will be populated with a number of electronic devices by pressing the parts downward into the part receiving areas, deflecting the upper tabs downward until the upper tabs snap over the tops of the parts. The populated tape will then be wound onto a supply reel.

As described above, the flexible tape will be constructed of a material suitable to convey the electronic devices through a manufacturing process without removing the electronic devices from the tape. The tape containing one or more electronic devices mounted in a plurality of part receiving areas located within the tape with the electronic devices secured to the tape by a retention channel encompassing each part receiving area will be unwound from the supply reel. The tape containing the electronic devices will then be conveyed through a manufacturing process for the devices. The flexible tape containing the electronic devices is then wound onto a take-up reel at the end of the manufacturing process.

In some applications, a portion of the electronic device may be an integrated circuit. Additionally, the manufacturing process may include a high temperature baking process such as an epoxy curing process. In some applications, the manufacturing process may further include a testing process conducted while the electronic devices are still mounted on the tape. Depending on customer requirements, a user of such tapes may ship finished electronic devices to a customer while still mounted on the tape. Therefore, the devices can remain on the tape from the substrate supplier through manufacturing and testing and through shipment to customers.

What is claimed is:

1. A method to transport electronic devices, comprising: conveying electronic devices via a tape without removing the electronic devices from the tape, the tape having the electronic devices mounted, wherein the tape having part receiving areas having dimensions suitable to hold at least one of the electronic devices, wherein each of the electronic devices having a top portion and a bottom portion; and encompassing each part receiving area via a plurality of retention channels, each retention channel extending an entire length along each edge of each part receiving area, wherein the top portion of each of the electronic devices are accessible while being held in the plurality of retention channels, each retention channel having an upper tab and a lower tab, wherein the upper tab is flush with an upper surface of the tape and extends into a part receiving area and the lower tab extends below a lower surface of the flexible tape and into the part receiving areas, and extending a protective fence downward from the lower tab.

2. The method of claim 1, wherein the electronic devices comprise integrated packages.

3. The method of claim 1, wherein the tape further comprises protective fences extending downward from the lower tabs.

4. The method of claim 1, wherein the tape further comprises part positioning brackets.

5. The method of claim 4, further comprising forming the part positioning brackets by a bent down portion of the upper tab of the retention channel.

6. The method of claim 1, further comprising constructing the tape using a material capable of withstanding temperatures of approximately 240 degrees centigrade.

7. The method of claim 6, wherein the material comprises metal.

8. The method of claim 6, wherein the material comprises a high temperature polymer.

* * * * *